(12) United States Patent
Brandt

(10) Patent No.: US 6,169,427 B1
(45) Date of Patent: Jan. 2, 2001

(54) SAMPLE AND HOLD CIRCUIT HAVING SINGLE-ENDED INPUT AND DIFFERENTIAL OUTPUT AND METHOD

(75) Inventor: Brian Paul Brandt, Windham, NH (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/208,654

(22) Filed: Dec. 10, 1998

(51) Int. Cl.$^7$ ...................................................... H03M 1/66
(52) U.S. Cl. ................................................ 327/94; 327/95
(58) Field of Search ............................... 327/91, 93, 94, 327/95, 96, 337, 554

(56) References Cited

U.S. PATENT DOCUMENTS

| | | | | |
|---|---|---|---|---|
| 4,988,900 | * | 1/1991 | Fensch | 307/494 |
| 5,963,156 | * | 10/1999 | Lewicki et al. | 3441/122 |

OTHER PUBLICATIONS

B. Rothenberg, et al., "A 20–Msample/s switched–capacitor finite–impulse response filter using a transposed structure", IEEE J. Solid–State Circuits, pp. 1350–1356, (Dec. 1995).

G. Nicollini, et al., "A fully differential sample–and–hold circuit for high–speed applications", IEEE J. Solid–State Circuits, pp. 1461–146 (Oct. 1989).

G. Uehra, et al., "A 100 MHz A/D interface for PRML magnetic disk read channels", IEEE J. Solid–State Circuits, pp. 1606–1613 (Dec. 1994).

A 10–b 20–Msample/s Low–Power CMOS ADC, Won Chul Song, Hae–Wook Choi; Sung–Ung Kwak and Bang–Sup Song, *Senior Member*, IEEE; IEEE Journal Solid–State Circuits, vol. 30, No. 5, May, 1995, pp. 514–517.

* cited by examiner

*Primary Examiner*—Tuan T. Lam
*Assistant Examiner*—Linh Nguyen
(74) *Attorney, Agent, or Firm*—Limbach & Limbach L.L.P.

(57) ABSTRACT

A sample and hold circuit having a single-ended input and a differential output. Switching circuitry operates to couple first and second input capacitors to the single-ended input and to a reference voltage, respectively, when in a sample mode. The switching circuitry also operates in the sample mode to connect a first pair of feedback capacitors between the inputs and outputs of a differential amplifier and to connect a second pair of capacitors between known reference voltages. During the hold mode, the switching circuitry causes the charge present on the input capacitors to be transferred equally to the second pair of feedback capacitors so that the output of the differential amplifier is a differential representation of the single-ended input. At the beginning of the subsequent sample mode, the switching circuitry causes the charge on the second pair of feedback capacitors to be transferred to the first pair so that same differential representation will be present at the output when a new input is being connected to the first and second input capacitors.

33 Claims, 8 Drawing Sheets

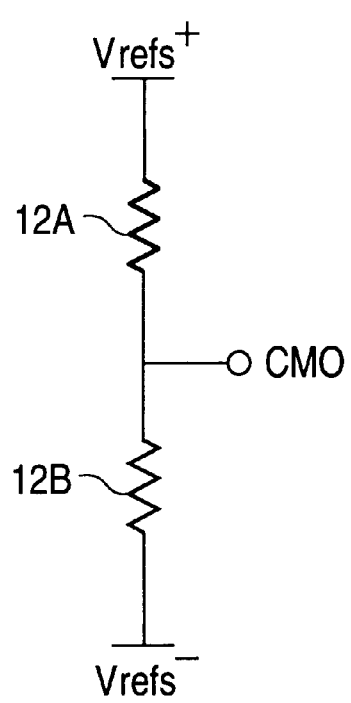
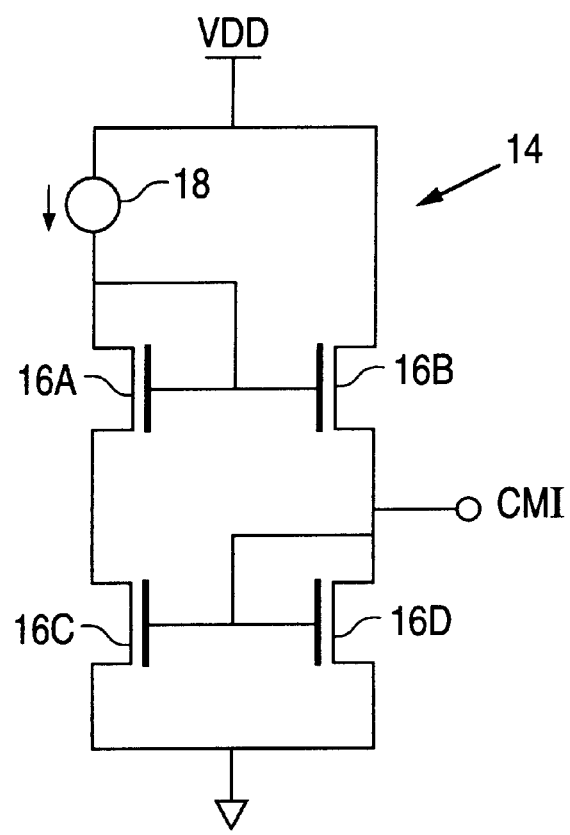
FIG. 9A  FIG. 9B ated by the numeral 8, is comprised of a

SAMPLE AND HOLD CIRCUIT HAVING SINGLE-ENDED INPUT AND DIFFERENTIAL OUTPUT AND METHOD

BACKGROUND OF THE INVENTION

The present invention relates generally to sample and hold circuits and, in particular, to sample and hold circuits which convert a single-ended input to a differential output.

DESCRIPTION OF RELATED ART

In many signal processing applications, an analog signal is produced which is to be further processed by, for example, converting the signal to a digital form. Many such analog signals are originally produced as a single-ended signal which is referenced to a circuit common. Single-ended signals are typically processed using circuitry which is asymmetric with respect to the circuit common. It is well known that a differential signal, a signal which represents the instantaneous, algebraic difference between two signals, both of which are referenced to a circuit common, provides several advantages over single-ended signals. One such advantage is improved immunity to noise where the noise is added equally to both components of the differential signal. Since differential signals are usually processed using balanced circuitry which responds to differences between inputs and which suppresses common mode signals such as noise present on both components, improved immunity to noise is achieved.

There is a need for circuitry which is capable of converting a single-ended analog signal to a differential signal. Such circuitry should be capable of operating at relatively high frequencies and should be capable of implementation in integrated circuit form, including CMOS implementations. Further, in order to enhance the operating speed it is preferably that such circuitry be capable of simultaneously sampling a new single-ended analog input while holding a differential signal output produced from an previous analog input so that the differential signal output can be processed by additional circuitry.

There exists prior art circuitry which is capable of providing some of the advantages of single-ended to differential conversions noted above, but not all of such advantages. As will become apparent to those skilled in the art upon a reading of the following Detailed Description of the Invention together with the drawings, unlike the prior art, the subject invention is capable of providing all of these and other advantages.

SUMMARY OF THE INVENTION

A sample and hold circuit having a single-ended input and a differential output is disclosed. The circuit includes a differential amplifier having first and second inputs and first and second outputs, with the first and second outputs functioning as the differential output. First and second input capacitors are provided together with third, fourth, fifth and sixth feedback capacitors.

Switching circuitry is provided which is configured to switch between a sample mode and a hold mode. When in the sample mode, the switching circuitry operates to couple a first side of the first capacitor to the input, to couple a first side of the second capacitor to a first reference voltage, to couple second sides of the first and second capacitors together. In addition, the switching circuitry, when in the sample mode, is operable to couple first and second sides of the third capacitor to the first input and first output of the differential amplifier, respectively, to couple first and second sides of the fourth capacitor to the second input and second output, respectively, of the differential amplifier, to couple a first side of the fifth capacitor and a first side of the sixth capacitor to the first and second inputs of the differential amplifier, respectively, and the second sides of the fifth and sixth capacitors to second and third reference voltages, respectively.

When in the hold mode, the switching circuitry is operable to couple the first sides of the first and second capacitors together, to couple the second sides of the first and second capacitors to the first and second inputs of the differential amplifier, respectively, to couple the first sides of the fifth and sixth capacitors to the first and second inputs of the differential amplifier, respectively, and to couple the second sides of the fifth and sixth capacitors to the first and second outputs of the differential amplifier, respectively.

One aspect of this arrangement is that the differential output which corresponds to the input can be stored on the fifth and sixth feedback capacitors in the hold mode and the same input can then held on the third and fourth capacitors in the subsequent sample mode. This permits the output of the sample and hold circuit to be used during both the hold and the subsequent sample modes.

BRIEF DESCRIPTION OF THE DRAWINGS

FIGS. 9A and 9B are schematic diagrams of circuits for generating the common mode output voltage and common mode input voltage, respectively, of the FIG. 8 differential amplifier.

DETAILED DESCRIPTION OF THE INVENTION

Figure 1:
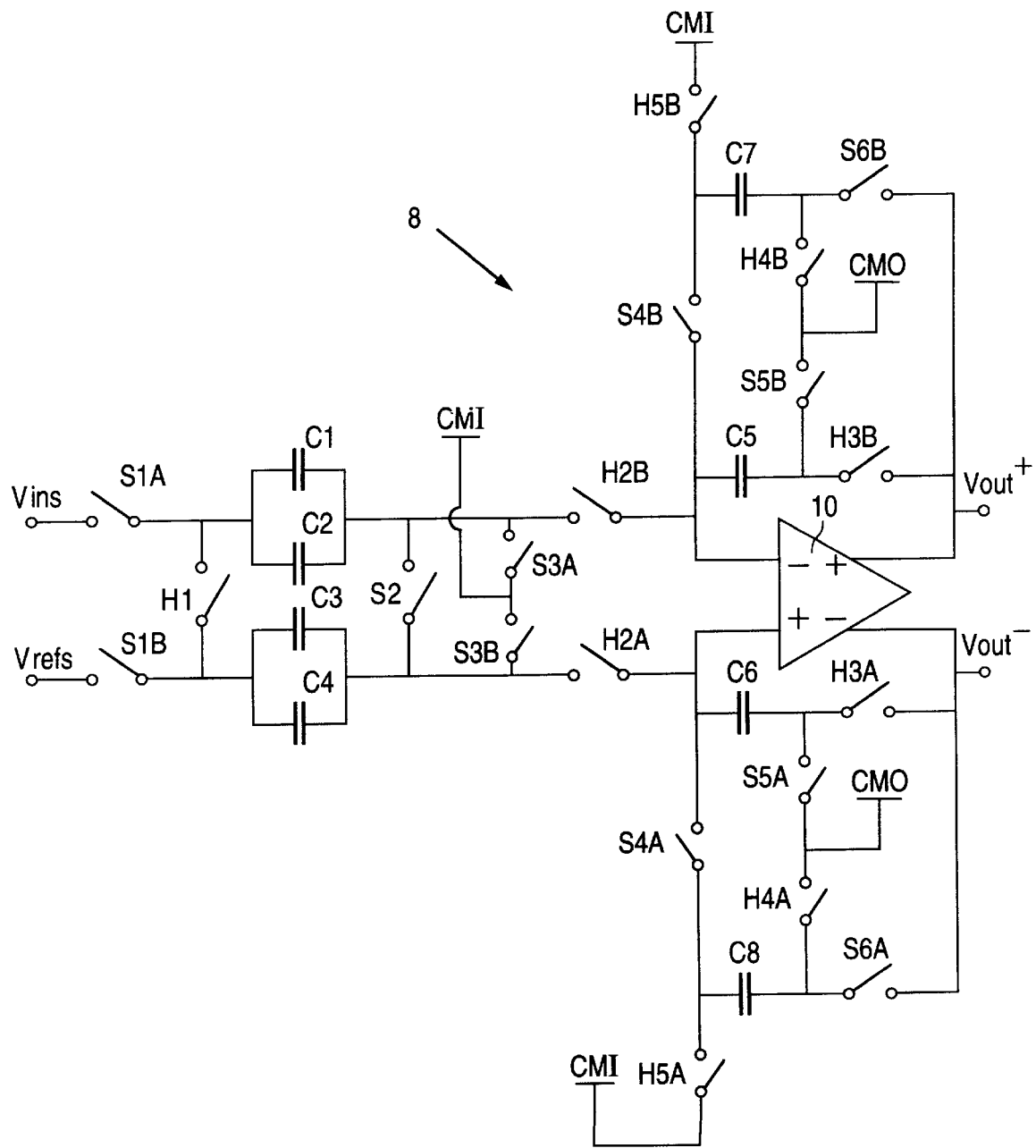
FIG. 1 is a schematic diagram of a first embodiment of a sample and hold circuit in accordance with the present invention.
Figure 7:
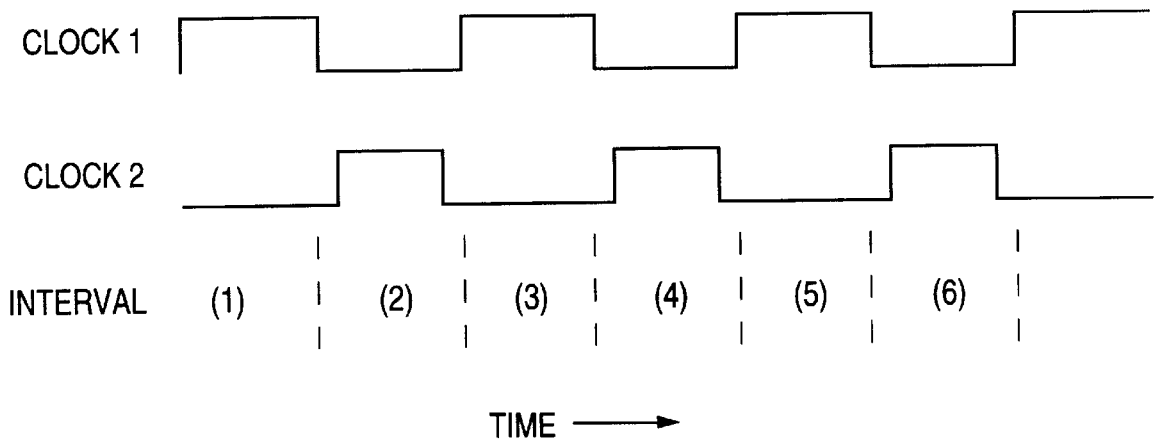
FIG. 7 is a timing diagram showing the two non-overlapping clocks for controlling the subject sample and hold circuits.

FIG. 1 is a schematic diagram of a first embodiment of the subject sample and hold circuit which converts single-ended analog inputs to differential analog outputs. The circuit, generally designated by the numeral 8, is comprised of a fully differential amplifier 10 and capacitors C1 through C8, with all of the capacitors being of the same value. As will become apparent, the relative size of the capacitors can be changed to achieve different circuit gains. Circuit 8 further includes several analog switches which are controlled by a standard two-phase non-overlapping clocking scheme. FIG. 7 is a timing diagram showing non-overlapping Clock 1 and Clock 2.

The analog switches can each be implemented using a P-type and an N-type transistor connected in parallel, with one polarity of the clock being applied to the gate of the P-type transistor and an opposite polarity of the same clock being applied to the gate of the N-type transistor. However, as will be explained later, it is possible to implement some of the switches using only N-type transistors. As is well known, the P-type transistor half of the switch operates to conduct the signal being transferred when the signal is a high voltage, the N-type conducts the low voltages and both operate to conduct the intermediate voltages. One aspect of the present invention is that it is possible to control the size of the voltages that appear on some of the switches so that only N-type transistors need be used. Since N-type transistors are inherently more conductive than P-type devices for the same geometry, less die area is required to implement an N-type only switch and, more importantly, the associated capacitances are lower. In addition, lower charge injection occurs when the smaller N-type transistors are turned off.

The state of the switches is depicted in Table 1 below for each of the sample phase or mode and the hold phase or mode. Switches that are closed in the sample phase are clocked by Clock 1 (and the complement where required) and switches that are closed in the hold phase are clocked by Clock 2 (and the complement where required) a second one of the clock phases. Note that, although the expressions sample phase and hold phase are used, the subject circuit operates to continue to hold one input while sampling a new input.

TABLE 1

| SWITCHES | CLOCK PHASE | |
|---|---|---|
| | Sample | Hold |
| S1A; S1B | CLOSED | OPEN |
| H1 | OPEN | CLOSED |
| S2 | CLOSED | OPEN |
| S3A; S3B | CLOSED | OPEN |
| H2A; H2B | OPEN | CLOSED |
| H3A; H3B | OPEN | CLOSED |
| S4A; S4B | CLOSED | OPEN |
| H4A; H4B | OPEN | CLOSED |
| S5A; S5B | CLOSED | OPEN |
| S6A; S6B | CLOSED | OPEN |
| H5A; H5B | OPEN | CLOSED |

As can be seen in FIG. 1, a single-ended analog input Vins is connected to an input terminal of switch S1A. A reference voltage Vrefs, ideally set to the desired midpoint of the input Vins voltage swing, is connected to an input terminal of switch S1B. Thus, for an input Vins which varies between +1 and +3 volts, Vrefs should be set to +2 volts.

A node intermediate switches S3A and S3B is connected to a low impedance voltage source which outputs a voltage CMI which defines the desired common mode input voltage for differential amplifier 10. CMI is also selected to be a relatively low value so that certain ones of the switches can be implemented using only N-type transistors, the advantages of which were previously noted. Those switches are S2, S3A, S3B, H2A, H2B, S4B, S4A, H5A and H5B. Assuming a supply voltage of +5 volts, CMI is set to +1.5 volt in the present exemplary embodiment. A further voltage source outputs a voltage CMO connected to one node between switches S5A and H4A and a second node between switches S5B and H4B. Voltage CMO defines the desired common mode output voltage of amplifier 10. In the present example, if the output voltage swing of the sample and hold amplifier circuit 8 varies between +1.5 volts (Vrefs$^-$) and +3.5 volts (Vrefs$^+$), voltage CMO is set to +2.5 volts. This converts to a differential voltage swing between −2 volts and +2 volts. Voltage CMO, which is not required to have the same low output impedance as the voltage source for CMI, can be produced using a resistive voltage divider as will be explained.

Figure 2A:
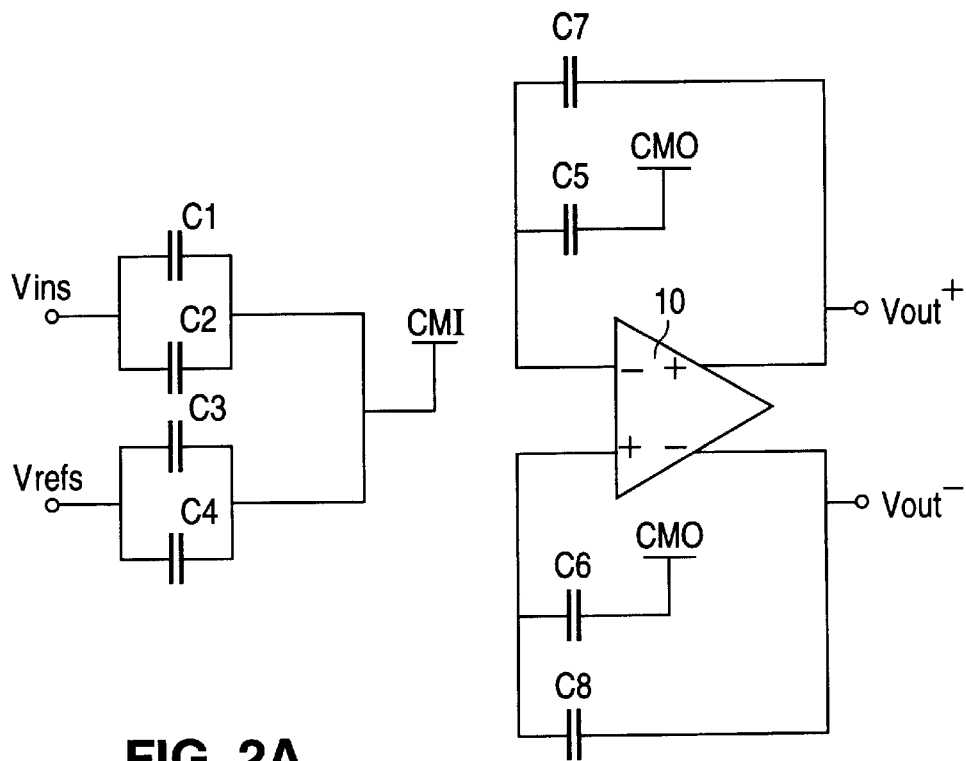
FIGS. 2A and 2B are equivalent circuits of the first embodiment sample and hold circuit during the sample and hold phases, respectively.

FIG. 2A shows an equivalent circuit for the sample and hold amplifier circuit 8 during the sample phase where the switch states are as depicted in Table 1. This occurs during interval (1) as shown in the FIG. 7 timing diagram. Since switches H2A and H2B are open, the sampling network, which includes input capacitors C1 through C4, is isolated from the amplification network, which includes amplifier 10 and hold capacitors C5 through C8. A voltage equal to the difference between Vins and CMI is developed across the parallel combination of capacitors C1 and C2. A voltage equal to the difference between Vrefs and CMI is developed across the parallel combination of capacitors C3 and C4.

The inner set of hold capacitors, C5 and C6, are both reset, with one terminal connected to the common mode output voltage CMO and the second terminal connected to the inverting and non-inverting input, respectively, of amplifier 10. Outer capacitors C7 and C8 have one terminal connected to the non-inverting and inverting inputs of amplifier 10, respectively, and the second terminals connected to the positive and negative differential outputs, respectively. The inputs of amplifier 10 will be at the common mode input voltage CMI at this point, for reasons that will be subsequently explained. For purposes of analysis, it is assumed that the second terminals of capacitors C7 and C8 are at the same voltage, that is, Vout$^+$ and Vout$^-$ are the same. In fact, as will be explained, Vout+ and Vout− are at a voltage determined by the previous sample phase.

At the end of the first sample phase, interval (1), all of the closed switches operating at voltage CMI, including switches S2, S3A, S3B, S4A and S4B are opened, rapidly followed by the opening of the remaining closed switches, including switches S1A, S1B, S5A, S5B, S6A and S6B. As is well known, this staged sequence of opening switches significantly reduces signal-dependent charge injection. After a small further delay, Clock 2 goes high causing the open switches, including switches H1, H2A, H2B, H3A, H3B, H4A, H4B, H5A and H5B, to close thereby resulting in entry into the hold phase. Note that when the sample and hold circuit subsequently switches from the hold phase back to the sample phase the timing of the switch openings is staged in a similar manner to reduce the effects of charge injection. In particular, switches H2A, H2B, H5A and H5B are opened first, rapidly followed by the opening of the remaining closed switches H1, H3A, H3B, H4A and H4B.

Figure 2B:
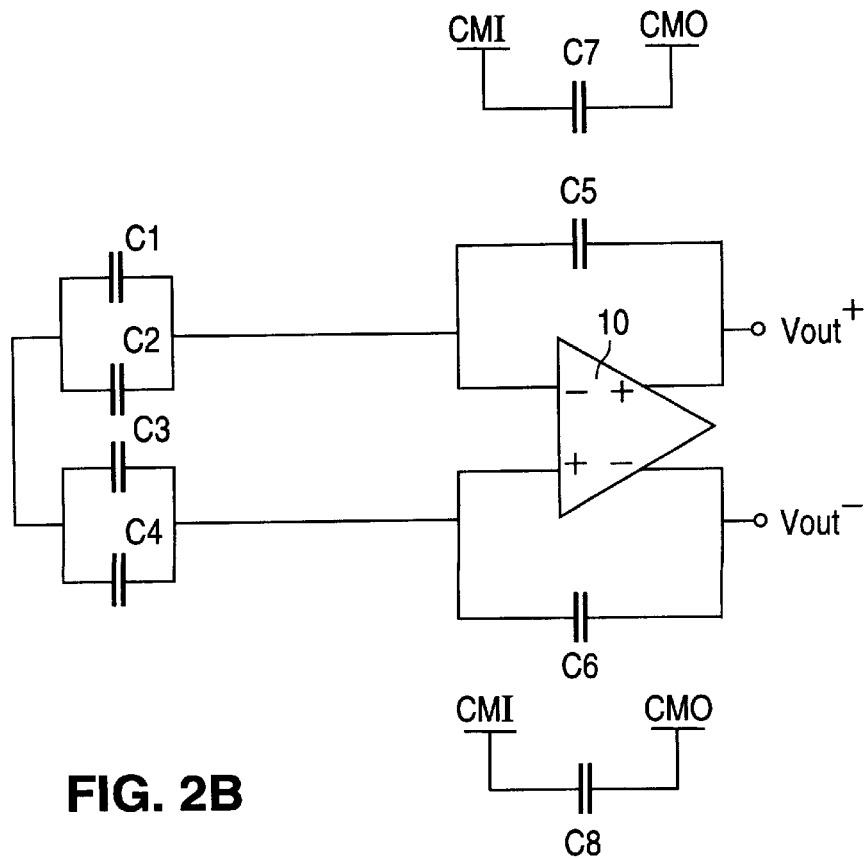

FIG. 2B shows the equivalent circuit of the sample and hold amplifier circuit 8 when the switches are placed in the hold phase as shown in Table 1. The input terminals of input capacitors C1, C2, C3 and C4 are shorted together by switch H1 (FIG. 1) so that the input terminals assume a voltage which is nominally half way between input Vins and Vrefs. At the end of the sample phase (FIG. 2A) and just prior to entry into the hold phase, the total voltage drop across the series combination of capacitors C1/C2 and C3/C4 is equal to the difference Vins and Vrefs.

The output terminals of capacitors C1 and C2 are connected to the inverting input of amplifier 10, with the output terminals of capacitors C3 and C4 being connected to the non-inverting input. The output terminals of capacitors C1, C2, C3 and C4 are at voltage CMI so that both inputs of differential amplifier 10, which are at a high impedance, will be driven to voltage CMI. Capacitors C7 and C8 are disconnected from amplifier 10 and reconnected between voltages CMI and CMO. A charge transfer takes place from the parallel combination of input capacitors C1 and C2 and from the parallel combination of input capacitors C3 and C4 so that the total charge on the four capacitors will be split equally between feedback capacitors C5 and C6. Because the parallel input capacitance is twice that of the feedback capacitance, the voltage gain of the charge transfer is two. Thus, the differential output voltage Vout⁺ and Vout⁻ will be equal in magnitude to twice the difference between Vins and Vrefs and will be centered about voltage CMO.

The processing of the first sampled input is concluded during the next sample phase, interval (3) starting when Clock 2 goes low. At that time, the output terminals of capacitors C5 and C6 are disconnected from the amplifier 10 outputs. In addition, capacitors C7 and C8 are disconnected from voltage sources CMI and CMO. A short time later when Clock 1 goes high, capacitors C7 and C8 are connected between the inputs and outputs of amplifier 10 as shown in FIG. 1A. At the same time, the output terminals of capacitors C5 and C6 are connected to voltage source CMO thereby causing the charge on capacitor C5 to be transferred to capacitor C7 and the charge on capacitor C6 to be transferred to capacitor C8.

Note that the voltage across C5 during the sample phase (FIG. 2A), the difference between CMI and CMO, is the same voltage as across capacitor C7 during the hold phase (FIG. 2B). Similarly, the voltage across C6 in the sample phase is the same as the voltage across C8 in the hold phase. Since capacitors C5 through C8 are the same value, it can be seen that all of the charge that was present on capacitor C5 in the hold phase is transferred to capacitor C7 in the sample phase and all of the charge on capacitor C6 in the hold phase is transferred to capacitor C8 in the sample phase.

Accordingly, the output voltage of the sample and hold amplifier circuit 8 will remain unchanged during interval (3) while the new input Vins is being sampled. This permits the sample and hold amplifier circuit 8 output to drive additional circuitry (not depicted) during both interval (2) and interval (3).

At the end of interval (3), the second input Vins has been sampled. The differential output Vout⁺ and Vout⁻ which corresponds to the second input is held for further processing during both interval (4) and interval (5).

FIG. 9A shows the manner in which voltage CMO, which is +2.5 volts, is produced. A voltage divider comprising equal value resistors 12A and 12B is connected between voltages Vrefs⁺ (+3.5 volts) and Vrefs⁻ (+1.5 volts), those being the maximum and minimum voltages, respectively, for the differential output of amplifier 10. Voltages Vrefs⁺ and Vrefs⁻ also define the upper and lower limits, respectively, of a valid input Vins. Resistors 12A and 12B are each 2 kΩ so that voltage CMO will be one-half the difference between Vrefs⁺ and Vrefs⁻.

The circuit 14 used to generate voltage CMI is shown in FIG. 9B. Circuit 14 includes N-type transistors 16A, 16B, 16C and 16D, with diode-connected transistor 16A connected to receive the output of a bandgap current reference circuit 18. Voltage CMI is the gate-source voltage of diode-connected transistor 16D. Current through transistor 16D is controlled so as to maintain the gate-source voltage of transistor 16D at +1.5 volts, the previously-noted target value for CMI. Bandgap current source 18 provides a constant current of 250μ amperes which is mirrored by transistor 16C into transistor 16D. Transistor 16D has a channel W/L ratio which is three times greater than that of transistor 16C so that the current through transistor 16D will be 750 μamperes. Transistor 16B also has an effective W/L which is three times greater than that of transistor 16A.

Circuit 14 provides a relatively low output impedance. In the event circuit 14 is caused to source substantial current, there will be a tendency for voltage CMI to decease. Since the gate of transistor 16C is connected to the output, the drop in CMI will result in less current flow through transistor 16C. Reduced current flow in transistor 16C will cause the gate voltage of transistors 16A and 16B to increase thereby causing transistor 16B to turn on harder thereby pulling up voltage CMI. Conversely, if circuit 14 is caused to sink substantial current, voltage CMI will tend to increase. This will raise the gate voltage of transistor 16D and cause the transistor to turn on harder so that the transistor will sink additional current. In addition, the gate voltage of transistor 16C will increase causing the transistor to draw more current which will pull down the voltage of the gate of transistors 16A and 16B. This will decrease the amount of current provided by transistor 16B to transistor 16D so that a greater portion of the current drawn by transistor 16D is from the load. This will cause CMI to fall back down to the nominal level.

Figure 8:
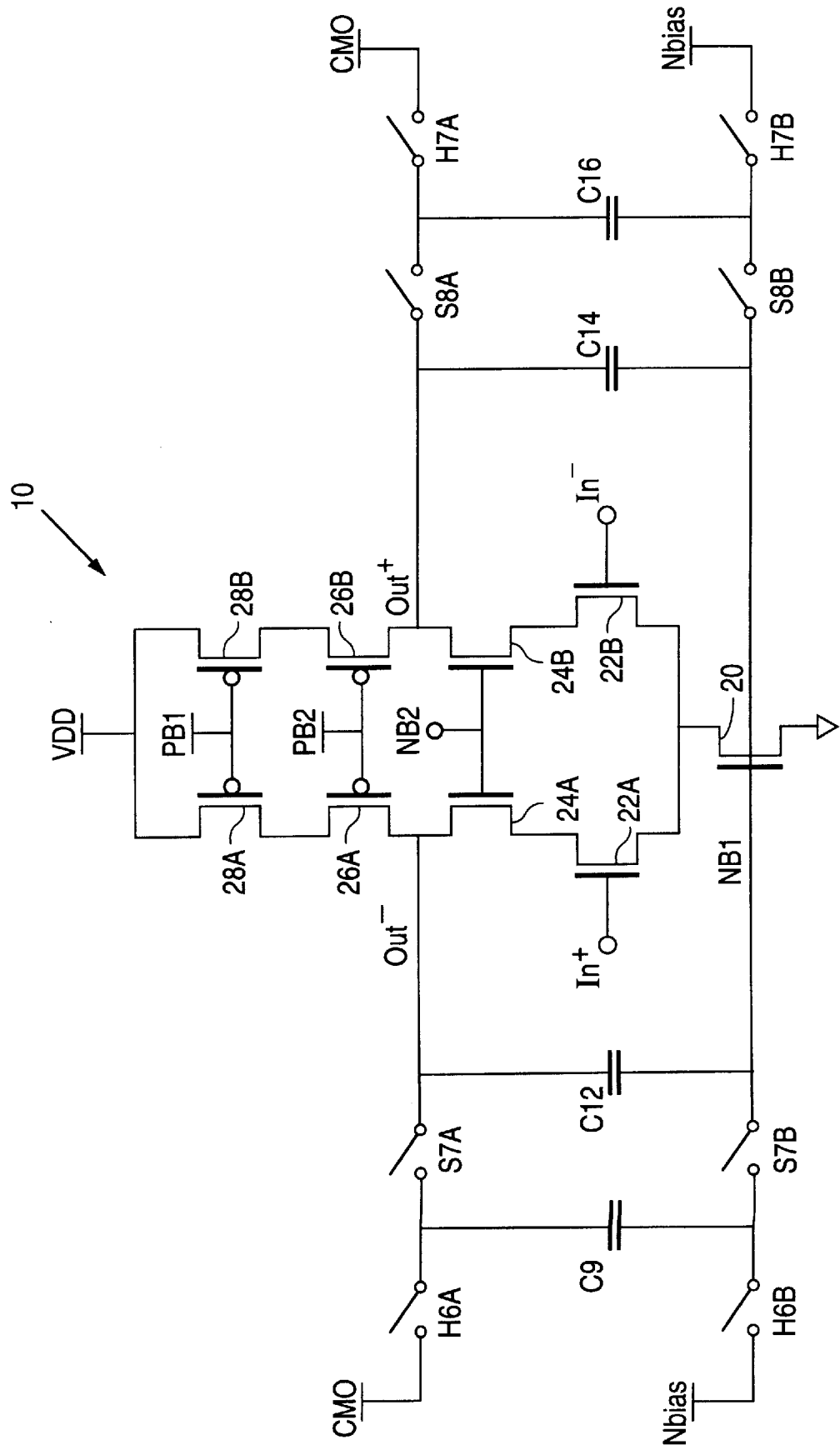
FIG. 8 is a schematic diagram of the differential amplifier used in the sample and hold circuit.

FIG. 8 is a schematic diagram of differential amplifier 10. The amplifier utilizes a telescopic cascode amplifier architecture which permits high gain and high speed operation. The gates of N-type transistors 22A and 22B provide the inputs In+ and In− to the amplifier, with the sources connected to transistor 20 which forms the tail current source. The gate voltage of transistor 20, NB1, controls the current through the amplifier and thus the amplifier common mode output voltage.

Amplifier 10 includes cascoded N-type transistors 24A and 24B having gates connected to a bias voltage NB2. The amplifier load includes P-type transistors 26A and 26B having gates connected to a bias voltage PB2 and P-type transistors 28A and 28B having gates connected to a bias voltage PB1. The amplifier outputs, Out⁺ and Out⁻, are produced at the drain terminals of transistors 26A and 26B, respectively. The bias voltages, generated by circuitry not depicted, are selected so that associated transistors will operate in the saturation mode thereby maintaining a high gain. Capacitors C12 and C14 are connected between the gate of transistor 20 and the outputs Out⁺ and Out⁻, respectively, and operate to dynamically bias the amplifier.

During the hold phase, such as interval (2), switches H6A and H6B are closed thereby connecting an upper terminal of a capacitor C9 to common mode output voltage CMO and the lower terminal of the capacitor to a nominal bias voltage Nbias. Switches H7A and H7B connect the same voltages across capacitor C16. Switches S7A, S7B, S8A and S8B are off during the hold phase. During the next sample phase, switches H6A, H6B, H7A and H7B are opened followed by closure of switches S7A, S7B, S8A and S8B. A charge transfer takes place between capacitors C9 and C12 and between capacitors C16 and C14 so that, over time, the common mode component of Out− and Out+ is approximately equal to voltage CMO.

The differential voltage component of Out− and Out+ will have no effect on the gate voltage of transistor 20 since an increase in one component will be offset by a decrease in the other component. An increase in the common mode component of Out− and Out+ will increase the gate voltage of transistor 20 thereby increasing the current in the amplifier so as to reduce the common mode voltage. Similarly, a decrease in the common mode component will cause a drop in the amplifier current thereby increasing the common mode voltage. Thus, the common mode voltage output will tend to be stabilized around voltage CMO by way of negative feedback.

As previously noted, an important aspect of the subject invention is that the sampled output is held for two time intervals (two half clock cycles). This is accomplished without resorting to techniques sometimes referred to as "ping-pong" techniques in which certain circuit components are used for even input samples and other components are used for odd input samples. This prior art approach creates modulation artifacts due to the fact that there will always be some mismatch between components. In the present approach, there will be a finite mismatch between capacitor C5 and C7 and between C6 and C8. Thus, when there is a charge transfer between these capacitors, at the end of interval (2) for example, the held output voltage will change slightly. However, modulation artifacts are eliminated since each input sample is processed by the same signal path (same circuit components).

A further advantage of the present invention over certain prior art approaches is reduced sensitivity to the offset voltages of differential amplifier 10. By way of example, "A 10-b 20-Msample/s Low-Power CMOS ADC", IEEE Journal of Solid-State Circuits, Vol 30, No.5, May, 1995 by Song et al., shows at page 517, FIG. 6, a sample and hold circuit which converts a single-ended input into a differential output. The offset voltage referred to the input of this prior art sample and hold circuit is approximately twice the offset voltage of its differential amplifier for typical capacitor values. In the circuit of the present invention, the input-referred offset is less than twice the offset voltage of differential amplifier 10 thereby providing a significant improvement over the prior art of Song et al. In addition, the disclosed circuit is less sensitive than the prior art circuit of Song et al. to the finite DC gain of the differential amplifier 10.

Figure 3:
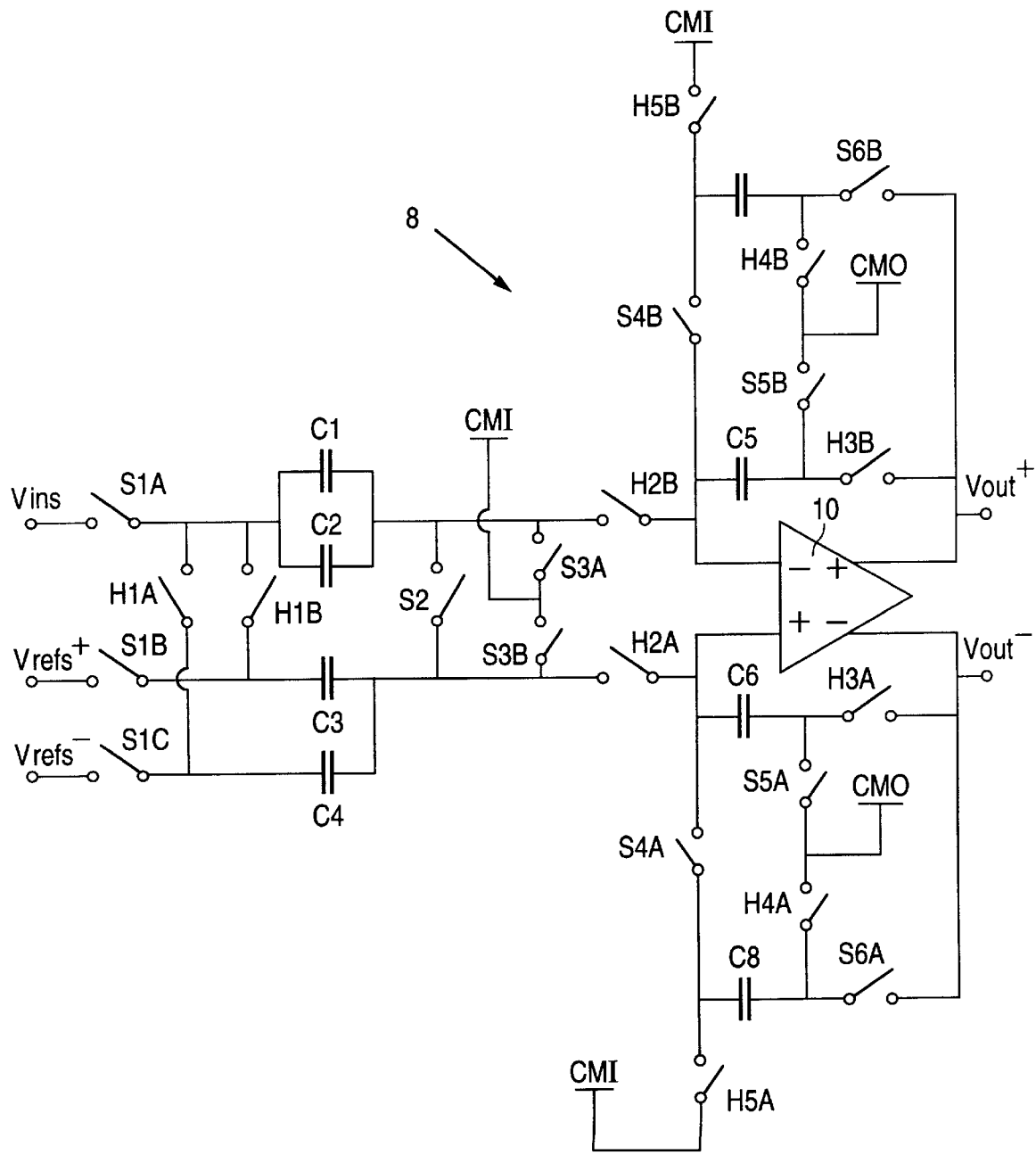
FIG. 3 is a schematic diagram of a second embodiment of a sample and hold circuit in accordance with the present invention.
Figure 4:
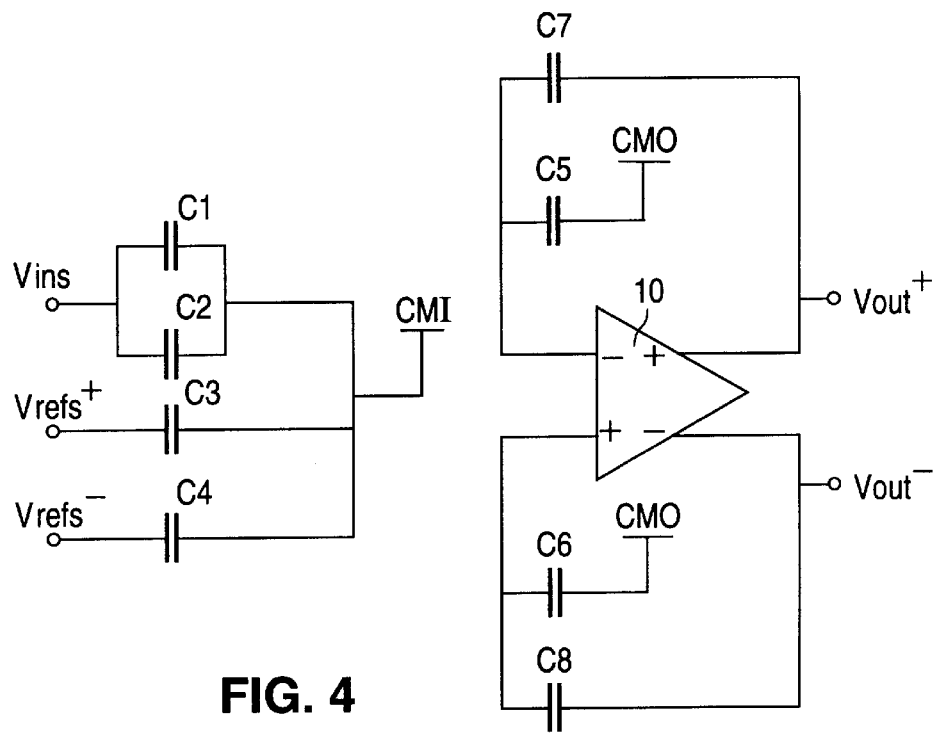
FIG. 4 is an equivalent circuit of the second embodiment sample and hold circuit during the sample phase.

FIG. 3 depicts an alternative embodiment of the subject invention where components performing generally related functions to that of FIG. 1 are designated by the same alphanumeric identifiers. FIG. 4 shows the equivalent circuit of the FIG. 3 embodiment when the circuit is in the sample phase. The equivalent circuit for the hold phase is shown in FIG. 2B, that being the same hold phase equivalent circuit for the FIG. 1 embodiment.

The FIG. 3 embodiment is useful where the valid upper and lower limits of input Vins are known to be at voltage Vrefs$^+$ and Vrefs$^-$. As previously discussed in connection with FIG. 9A, voltages Vrefs$^+$ and Vrefs$^-$ are also used to produce the common mode output voltage CMO. The midpoint of the input swing is generated from Vrefs$^+$ and Vrefs$^-$ using capacitor division and is particularly useful in applications where the valid upper and lower limits Vrefs$^+$ and Vrefs$^-$ are supplied from an external source and the midpoint is not available as in the FIG. 1 embodiment.

Upper reference voltage Vrefs$^+$ is connected to one terminal of switch S1B, with the remaining switch terminal being connected to the input side of capacitor C3. Lower reference voltage Vrefs$^-$ is connected to one terminal of switch S1C, with the remaining switch terminal being connected to the input side of capacitor C4. Switch H1 of the FIG. 1 embodiment is replaced with switches H1A and H1B in FIG. 3. Switch H1A is connected between the input side of capacitors C1/C2 and the input side of capacitor C4. Switch H1B is connected between the input side of capacitors C1/C2 and the input side of capacitor C3.

Table 1, above, shows the state of the FIG. 3 switches in both the sample and hold phases, with additional switch S1C having the same states as switches S1A and S1B and additional switches H1A and H1B having the same states as switch H1. Equal value capacitors C3 and C4 perform capacitor division so that the total charge on the two capacitors is equal to the total charge that would exist if the input side terminals of capacitors C3 and C4 were both connected to a voltage which is half way between upper and lower reference voltages Vrefs$^+$ and Vrefs$^-$. Thus, the equivalent of the midpoint voltage Vrefs used in the FIG. 1 embodiment is automatically generated when the FIG. 3 circuit is in the sample phase as shown in FIG. 4. Operation in the hold phase, which is the same as described in connection with the FIG. 1 embodiment, is shown in FIG. 2B.

Figure 5:
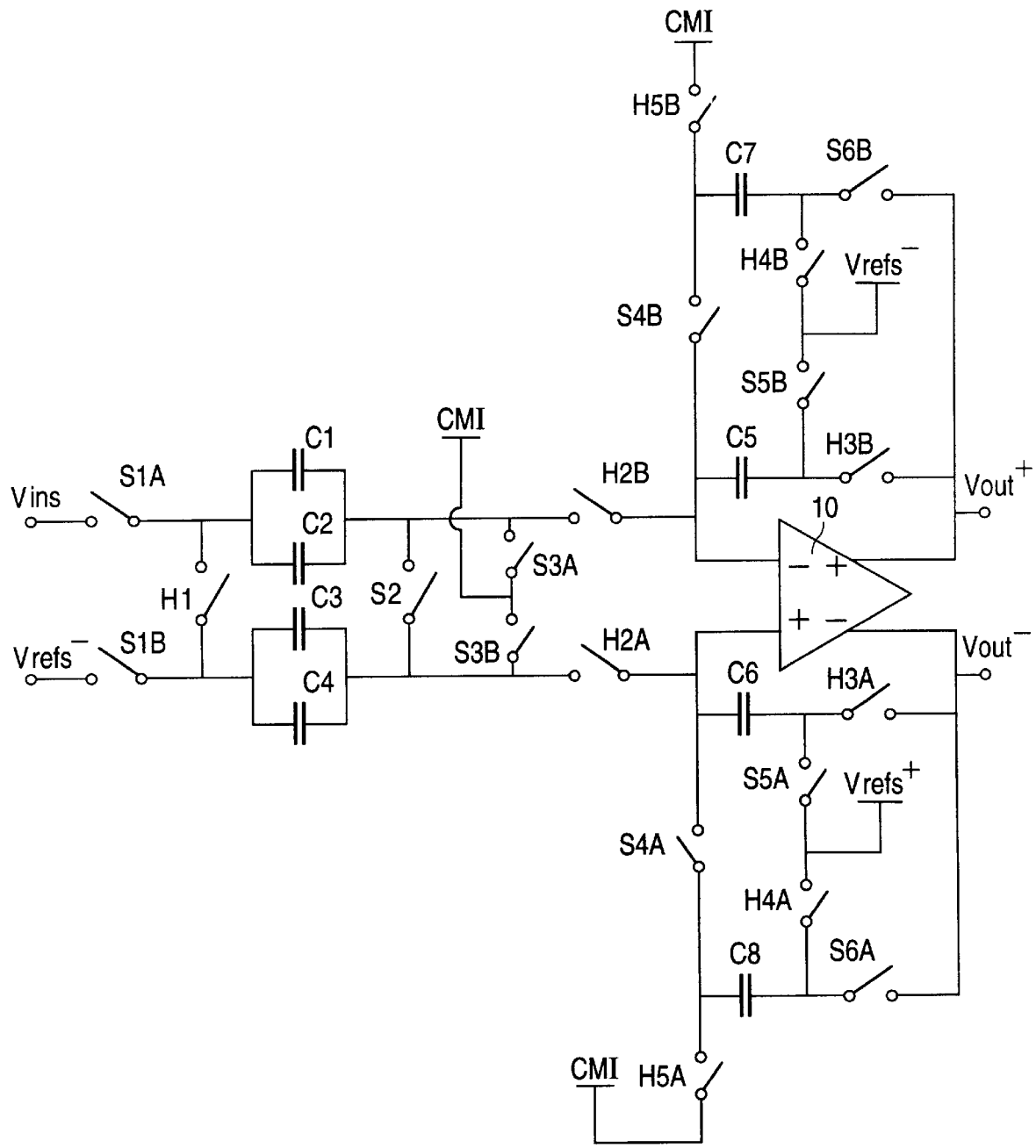
FIG. 5 is a schematic diagram of a third embodiment of a sample and hold circuit in accordance with the present invention.
Figure 6A:
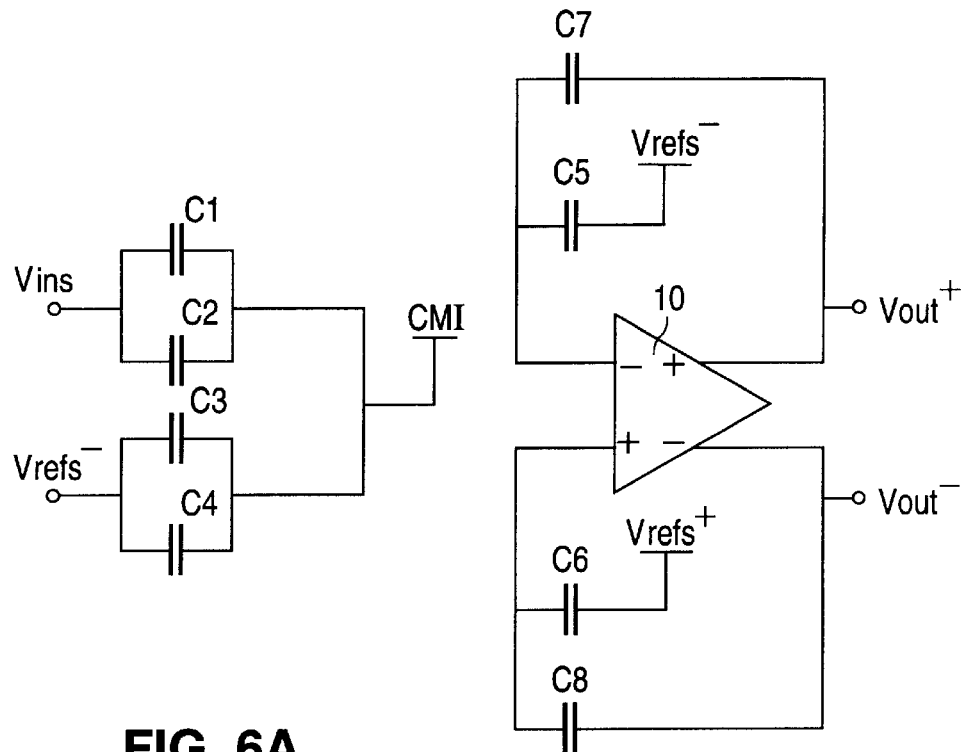
FIGS. 6A and 6B are equivalent circuits of the third embodiment sample and hold circuit during the sample and hold phases, respectively.
Figure 6B:
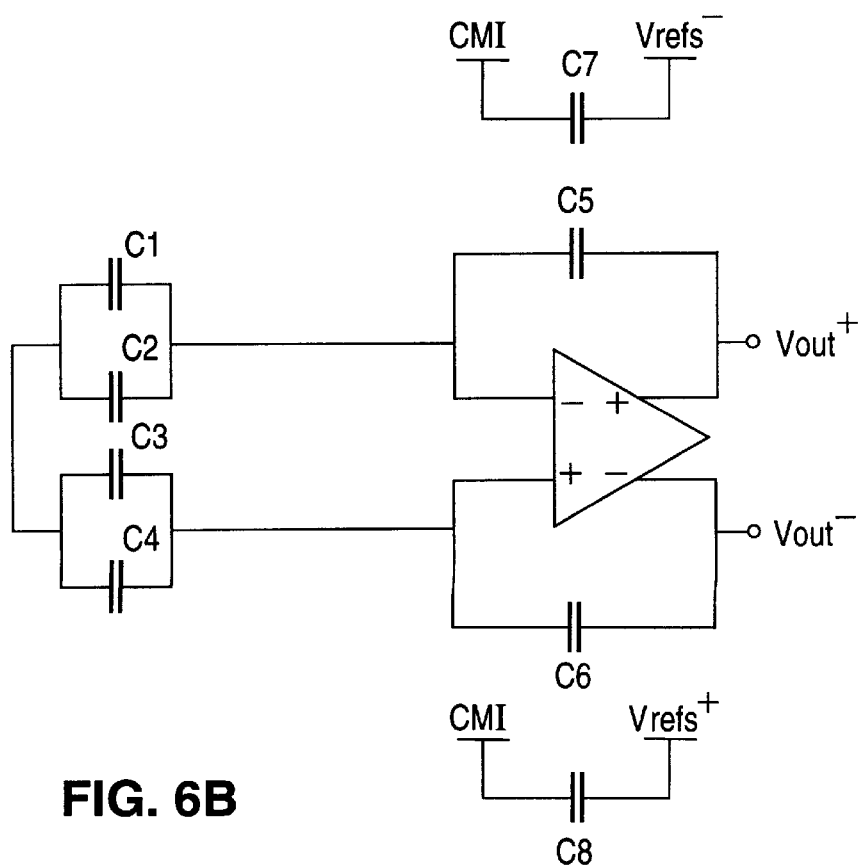

FIG. 5 is a further alternative embodiment of the subject invention. This embodiment differs from the FIG. 1 embodiment in that Vrefs$^-$ which, as previously noted, defines the lower valid limit of input Vins is used instead of midpoint voltage Vrefs. In order to maintain the same differential output for a given input as the FIG. 1 embodiment, voltage Vrefs$^-$ is used in lieu of CMO at the node intermediate switches H4B and S5B and voltage Vrefs$^+$, the upper valid input limit, is used in lieu of CMO at the node intermediate switches H4A and S5A. FIGS. 6A and 6B are equivalent circuits of the FIG. 5 embodiment in the sample phase and in the hold phase, respectively, with the state of the FIG. 5 embodiment switches being the same as shown in Table 1.

In the FIG. 5 embodiment, a reference voltage Vrefs$^-$ is applied to the input side of capacitors C3 and C4 by way of switch S1B. In addition, Vrefs$^-$ and Vrefs$^+$ is applied to the node between switches H4B and S5B and the node between switches H3A and S5A, respectively. As previously noted in connection with the FIG. 3 embodiment, reference voltages Vrefs$^-$ and Vrefs$^+$ define the lower and upper limits of the input Vins voltage swing.

The operation of the FIG. 5 embodiment is similar to that of FIG. 1, except it is not necessary to provide a reference Vrefs which is at the midpoint of the input range. However, the FIG. 5 circuit is more sensitive to noise coupled into the Vrefs$^-$ and Vrefs$^+$ nodes than are the FIG. 1 and FIG. 3 embodiments.

Thus, a novel sample and hold circuit has been disclosed. Although three embodiments of the invention have been described in some detail, it is to be understood that various changes can be made by those skilled in the art without departing from the spirit and scope of the invention as defined by the appended claims.

In the claims:

1. A sample and hold circuit having a single-ended input and a differential output comprising:
   a differential amplifier having first and second inputs and first and second outputs, with the first and second outputs functioning as the differential output;
   first and second input capacitors;
   third, fourth, fifth and sixth feedback capacitors;
   switching circuitry configured to switch between a sample mode and a hold mode, with the switching circuitry, when in the sample mode, operable to couple a first side of the first capacitor to the input, to couple a first side of the second capacitor to a first reference voltage, to couple second sides of the first and second capacitors together, to couple first and second sides of the third capacitor to the first input and first output of the differential amplifier, respectively, to couple first and second sides of the fourth capacitor to the second input and second output, respectively, of the differential amplifier, to couple a first side of the fifth capacitor and a first side of the sixth capacitor to the first and second inputs of the differential amplifier, respectively, and the second sides of the fifth and sixth capacitors to second and third reference voltages, respectively, and, when in the hold mode, to couple the first sides of the first and second capacitors together, to couple the second sides of the first and second capacitors to the first and second inputs of the differential amplifier, respectively, to couple the first sides of the fifth and sixth capacitors to the first and second inputs of the differential amplifier, respectively, and to couple the second sides of the fifth and sixth capacitors to the first and second outputs of the differential amplifier, respectively.

2. The circuit of claim 1 wherein the input has a valid range between first and second input voltages and the first reference voltage is selected to be at a voltage equal to an average of the first and second voltages.

3. The circuit of claim 2 wherein the switching circuitry is operable, when in the sample mode, to couple the second sides of the first and second capacitors to a fourth reference voltage.

4. The circuit of claim 3 wherein the switching circuitry is operable, when in the hold mode, to couple the first sides of the third and fourth capacitors to the fourth reference voltage.

5. The circuit of claim 4 wherein the fourth reference voltage is selected to be the common mode input voltage of the differential amplifier.

6. The circuit of claim 5 wherein the second and third reference voltages are set to a same common mode output voltage and wherein the switching circuitry is operable, when in the hold mode, to couple the second sides of the third and fourth capacitors to the common mode output voltage.

7. The circuit of claim 6 wherein the third through sixth capacitors each have a capacitance substantially equal to a first value and the first and second capacitors each have a capacitance substantially equal to twice the first value.

8. The circuit of claim 1 further comprising a seventh capacitor having a second side coupled to the second side of the second capacitor and wherein the switching circuitry, when in the sample mode, is operable to couple the first side of the seventh capacitor to a fourth reference voltage and when in the hold mode, is operable to couple the second side of the seventh capacitor to the second input of the differential amplifier.

9. The circuit of claim 8 wherein the input has a valid range between first and second input voltages, with the first and fourth reference voltages being substantially equal to the first and second input voltages, respectively.

10. The circuit of claim 9 wherein the switching circuitry is operable, when in the sample mode, to couple the second sides of the first, second and seventh capacitors to a fifth reference voltage.

11. The circuit of claim 10 wherein the switching circuitry is operable, when in the hold mode, to couple the first sides of the third and fourth capacitors to the fifth reference voltage.

12. The circuit of claim 11 wherein the fifth reference voltage is selected to be the common mode input voltage of the differential amplifier.

13. The circuit of 12 wherein the second and third reference voltages are set to a same common mode output voltage and wherein the switching circuitry is operable, when in the hold mode, to couple the second sides of third and fourth capacitors to the common mode output voltage.

14. The circuit of claim 13 wherein the second through seventh capacitors each have a capacitance substantially equal to a first value and the first capacitor has a capacitance substantially equal to twice the first value.

15. The circuit of claim 1 wherein the input has a valid range between first and second input voltages and the first reference voltage is substantially equal to the second input voltage, the second reference voltage is substantially equal to the second input voltage and the third reference voltage is substantially equal to the first input voltage.

16. The circuit of claim 15 wherein the switching circuitry is operable, when in the sample mode, to couple the second sides of the first and second capacitors to a fourth reference voltage.

17. The circuit of claim 16 wherein the switching circuitry is operable, when in the hold mode, to couple the first sides of the third and fourth capacitors to the fourth reference voltage.

18. The circuit of claim 17 wherein the fourth reference voltage is selected to be the common mode input voltage of the differential amplifier.

19. The circuit of claim 18 wherein the third through sixth capacitors each have a capacitance substantially equal to a first value and the first and second capacitors each have a capacitance substantially equal to twice the first value.

20. The circuit of claim 1 wherein the switching circuitry is operable, when in the sample mode, to couple the second sides of the first and second capacitors to a fourth reference voltage and is operable, when in the hold mode, to couple the first terminals of the third and fourth capacitors to the fourth reference voltage, to couple the second terminal of the third capacitor to the second reference voltage and to couple the second terminal of the fourth capacitor to the third reference voltage.

21. A sample and hold circuit having a single-ended input and a differential output comprising:

a differential amplifier having first and second inputs and first and second outputs, with the first and second outputs functioning as the differential output;

first and second input capacitors;

third, fourth, fifth and sixth feedback capacitors;

switching circuitry configured to switch between a sample mode and a hold mode, with the switching circuitry, when in the sample mode, operable to couple a first side of the first capacitor to the input, to couple a first side of the second capacitor to a first reference voltage, to couple second sides of the first and second capacitors together, to transfer substantially all of a charge present on the fifth capacitor to the third capacitor and substantially all of a charge present on the sixth capacitor to the fourth capacitor, to couple first and second sides of the third capacitor to the first input and first output of the differential amplifier, respectively, to couple first and second sides of the fourth capacitor to the second input and second output, respectively, of the differential amplifier, and, when in the hold mode, to couple the first sides of the first and second capacitors together, to couple the second sides of the first and second capacitors to the first and second inputs of the differential amplifier, respectively, to couple the first sides of the fifth and sixth capacitors to the first and second inputs of the differential amplifier, respectively, and to couple the second sides of the fifth and sixth capacitors to the first and second outputs of the differential amplifier, respectively.

22. The circuit of claim 21 wherein the switching circuitry is operable, when in the sample mode, to couple the first side of the fifth capacitor to the first input of the differential amplifier and the second side of the fifth capacitor to a second reference voltage, to couple the first side of the sixth capacitor to the second input of the differential amplifier and the second side of the sixth capacitor to a third reference voltage.

23. The circuit of claim 22 wherein the switching circuitry is operable, when in the sample mode, to couple the second sides of the first and second capacitors to a fourth reference voltage and is operable, when in the hold mode, to couple the first sides of the third and fourth capacitors to the fourth reference voltage, to couple the second side of the third capacitor to the second reference voltage and to couple the second side of the fourth capacitor to the third reference voltage.

24. The circuit of claim 23 wherein the fourth reference voltage is the common mode input voltage of the differential amplifier.

25. The circuit of claim 24 wherein the first and second capacitors have a capacitance substantially equal to twice a capacitance of the third, fourth, fifth and sixth capacitors.

26. The circuit of claim 23 wherein the input has a valid range between a first input voltage and a second input voltage and wherein the second reference voltage is equal to the second input voltage and the third reference voltage is equal to the first input voltage.

27. The circuit of claim 23 wherein the second and third reference voltages are equal to a common mode output voltage of the differential amplifier.

28. The circuit of claim 23 wherein the input has a valid range between a first input voltage and a second input voltage and wherein the circuit further includes a seventh capacitor having a second side coupled to the second side of the second capacitor and wherein the switching circuitry, when in the sample mode, is operable to couple the first side of the seventh capacitor to a fifth reference voltage and is operable, when in the hold mode, to couple the first side of the seventh capacitor to the first side of the second capacitor and wherein the first reference voltage is equal to the first input voltage and the fifth reference voltage is equal to the second input voltage.

29. The circuit of claim 28 wherein the first capacitor has a capacitance substantially equal to twice a capacitance of the second through seventh capacitors.

30. A method of sampling and holding an input, said method comprising:
carrying out a first sample operation, including
(a) coupling second sides of first and second capacitors together;
(b) coupling a first side of the first capacitor to the input;
(c) coupling a first side of the second capacitor to a first reference voltage; carrying out a first hold operation, including
(a) coupling first and second sides of a third capacitor to a first input and a first output, respectively, of a differential amplifier;
(b) coupling a second terminal of the first capacitor to the first input of the differential amplifier;
(c) coupling first and second sides of a fourth capacitor to a second input and a second output, respectively, of the differential amplifier;
(d) coupling a second terminal of the second capacitor to the second input of the differential amplifier, whereby the differential output indicative of the input of the first sample operation is produced at the first and second outputs of the differential amplifier;
carrying out a second sample operation, including
(a) coupling the second sides of the first and second capacitors together;
(b) coupling the first side of the first capacitor to the input;
(c) coupling the first side of the second capacitor to the first reference voltage;
(d) transferring charge on the third capacitor to a fifth capacitor;
(e) transferring charge of the fourth capacitor to a sixth capacitor;
(f) coupling the first and second sides of the charged fifth capacitor to the first input and first output, respectively, of the differential amplifier; and
(g) coupling the first and second sides of the charged sixth capacitor to the second input and second output, respectively, of the differential amplifier whereby the differential output indicative of the input of the first sample operation is produced at the first and second outputs of the differential amplifier in the second sample operation.

31. The method of claim 30 further wherein the carrying out of the first and second sample operations includes coupling the second sides of the first and second capacitors to a second reference voltage.

32. The method of claim 31 wherein the second reference voltage is a common mode input voltage of the differential amplifier.

33. The method of claim 32 wherein the input has a valid range between first and second input voltages and the first reference voltage is set midway between the first and second reference voltages.

* * * * *